(12) United States Patent
Akagi et al.

(10) Patent No.: US 9,349,908 B2
(45) Date of Patent: May 24, 2016

(54) METHOD FOR MANUFACTURING SEMICONDUCTOR LIGHT-EMITTING ELEMENT

(71) Applicant: STANLEY ELECTRIC CO., LTD., Meguro-ku, Tokyo (JP)

(72) Inventors: Takanobu Akagi, Tokyo (JP); Tatsuma Saito, Tokyo (JP); Mamoru Miyachi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/774,579

(22) PCT Filed: Mar. 5, 2014

(86) PCT No.: PCT/JP2014/055651
§ 371 (c)(1),
(2) Date: Sep. 10, 2015

(87) PCT Pub. No.: WO2014/141972
PCT Pub. Date: Sep. 18, 2014

(65) Prior Publication Data
US 2016/0027956 A1    Jan. 28, 2016

(30) Foreign Application Priority Data
Mar. 12, 2013 (JP) .................................. 2013-049003

(51) Int. Cl.
*H01L 33/20* (2010.01)
*H01L 33/22* (2010.01)
(Continued)

(52) U.S. Cl.
CPC .............. *H01L 33/005* (2013.01); *H01L 33/16* (2013.01); *H01L 33/20* (2013.01); *H01L 33/22* (2013.01); *H01L 33/32* (2013.01)

(58) Field of Classification Search
None
See application file for complete search history.

(56) References Cited

U.S. PATENT DOCUMENTS 7,601,621 B2 * 10/2009 Choi ....................... H01L 33/22
438/46
7,897,420 B2 * 3/2011 Chu ........................ H01L 33/20
257/98

(Continued)

FOREIGN PATENT DOCUMENTS

| JP | 2010147056 A | 7/2010 |
| JP | 2012186335 A | 9/2012 |
| WO | 2012160604 A1 | 11/2012 |

OTHER PUBLICATIONS

International Search Report (ISR) dated Apr. 1, 2014 issued in International Application No. PCT/JP2014/055651.

*Primary Examiner* — Robert Bachner
*Assistant Examiner* — Molly Reida
(74) *Attorney, Agent, or Firm* — Holtz, Holtz & Volek PC

(57) ABSTRACT

Provided are a highly reliable semiconductor light-emitting element having uniform protrusions that are arranged regularly and have the same size and a method of producing the same. The method of producing a semiconductor light-emitting element according to the present invention includes: forming a mask layer having a plurality of openings that are arranged at equal intervals along a crystal axis of a semiconductor structure layer on the surface of the semiconductor structure layer; performing a plasma treatment on the surface of the semiconductor structure layer exposed from the openings in the mask layer; removing the mask layer; and wet-etching the surface of the semiconductor structure layer to form protrusions on the surface of the semiconductor structure layer.

4 Claims, 6 Drawing Sheets

(51) Int. Cl.
*H01L 33/00* (2010.01)
*H01L 33/16* (2010.01)
*H01L 33/32* (2010.01)

(56) References Cited

U.S. PATENT DOCUMENTS

| | | |
|---|---|---|
| 8,822,247 B2 | 9/2014 | Saito |
| 9,257,595 B2 * | 2/2016 | Haruta .................. H01L 33/22 |
| 2008/0044937 A1 * | 2/2008 | Choi ..................... H01L 33/22 438/47 |
| 2008/0142814 A1 * | 6/2008 | Chu ...................... H01L 33/22 257/79 |
| 2009/0087994 A1 * | 4/2009 | Lee .................. H01L 21/30617 438/704 |
| 2014/0103391 A1 * | 4/2014 | Haruta ................. H01L 33/22 257/103 |
| 2014/0217457 A1 | 8/2014 | Cho et al. |

* cited by examiner

METHOD FOR MANUFACTURING SEMICONDUCTOR LIGHT-EMITTING ELEMENT

TECHNICAL FIELD

The present invention relates to a method of producing a semiconductor light-emitting element such as light-emitting diode (LED).

BACKGROUND ART

A semiconductor light-emitting element such as a light-emitting diode is generally manufactured by growing an n-type semiconductor layer, a light-emitting layer, and a p-type semiconductor layer on a substrate for growth, and forming an n-electrode and a p-electrode that are used to apply voltage to the n-type semiconductor layer and the p-type semiconductor layer, respectively.

As the semiconductor light-emitting element with the above-described structure to enhance the heat dissipation performance, a semiconductor light-emitting element having a structure in which a p-electrode is formed on a p-type semiconductor layer, an element is bonded to a supporting substrate through a joint layer, and a substrate for growth is removed, that is, a bonding structure, has been known.

As a technology of extracting much light emitted from a light-emitting layer outside, Patent Document 1 discloses a technology in which an exposed surface of an n-type semiconductor layer after removal of a substrate for growth is wet-etched with an alkaline solution, to form a plurality of protrusions derived from a crystal structure of a semiconductor.

CITATION LIST

Patent Document

Patent Document 1: Japanese Patent Application Laid-Open No. 2012-186335

SUMMARY OF THE INVENTION

Problem to be Solved by the Invention

A GaN-based semiconductor has a Wurtzite crystal structure. When a C-minus plane (C$^-$ plane) of a semiconductor layer formed of the GaN-based semiconductor is wet-etched with an alkaline solution, an uneven structure including hexagonal pyramid protrusions derived from the Wurtzite crystal structure is formed. When the uneven structure is formed on a surface of an n-type semiconductor layer as a light extraction surface, a probability of passing light emitted from a light-emitting layer through the uneven structure is high. Therefore, much light can extracted outside. Note that the protrusions derived from the crystal structure are referred to as micro-cones.

The technique described in Patent Document 1 has a point in which a plurality of recessed portions that are arranged along a crystal axis of the semiconductor material are formed on the C$^-$ plane of the n-type semiconductor layer exposed after removal of the substrate for growth, and the n-type semiconductor layer is then wet-etched with an alkaline solution.

The recessed portions formed on the surface of the n-type semiconductor layer function as etching control points in which etching rates are lower than those of other surface portions of the n-type semiconductor layer in wet-etching as a post-process. In order to allow the recessed portions to function as etching control points (etching rate-determining points), Patent Document 1 describes that it is preferable that various crystal planes other than the C$^-$ plane appear in the recessed portions, for example, the recessed portions have a cone shape, a circular cone shape, or a hemi-spheroidal shape.

However, when a recessed portion having a shape in which many C$^-$ planes appear, for example, a columnar shape is formed, the resistance degree to the progress of etching in the recessed portion is substantially the same as the resistance degree to the progress of etching in a portion other than the recessed portion. Therefore, the recessed portion does not function as an etching control point. When etching partially and excessively proceeds, there are problems in which an electrode material diffuses into an element and leakage of current occurs.

On the other hand, Patent Document 1 describes that the recessed portions are formed by dry etching such as reactive ion etching. The inventor of the present application have focused attention on situations in which it is difficult to control the shape and the depth of the recessed portions as the control points when dry etching is used. Specifically, when dry etching is used, recessed portions having various shapes such as a columnar shape and a polygonal columnar shape are formed. Therefore, it is difficult to form micro-cones that are arranged uniformly and regularly and have the same size.

The present invention has been made in view of the circumstances described above, and it is an object of the present invention to provide a method of producing a highly reliable semiconductor light-emitting element having uniform protrusions that are arranged regularly and have the same size.

Means to Solve the Problem

A method of producing a semiconductor light-emitting element according to the present invention is a method of producing a semiconductor light-emitting element including a semiconductor structure layer of a hexagonal crystal structure, the method including: forming a mask layer having a plurality of openings that are arranged at equal intervals along a crystal axis of the semiconductor structure layer on a surface of the semiconductor structure layer; performing a plasma treatment on the surface of the semiconductor structure layer exposed from the openings in the mask layer; removing the mask layer; and wet-etching the surface of the semiconductor structure layer to form a plurality of protrusions that are arranged according to the arrangement form of the plurality of openings and derived from the crystal structure of the semiconductor structure layer on the surface of the semiconductor structure layer.

DESCRIPTION OF EMBODIMENTS

The method of producing a semiconductor light-emitting element according to the present invention is characterized by performing a plasma treatment on a C⁻ plane of GaN of a hexagonal crystal structure, that is, a surface on an N-polarity side (N-polarity plane), followed by wet-etching with an alkaline solution. First, this plasma treatment will be briefly described.

Figure 1:
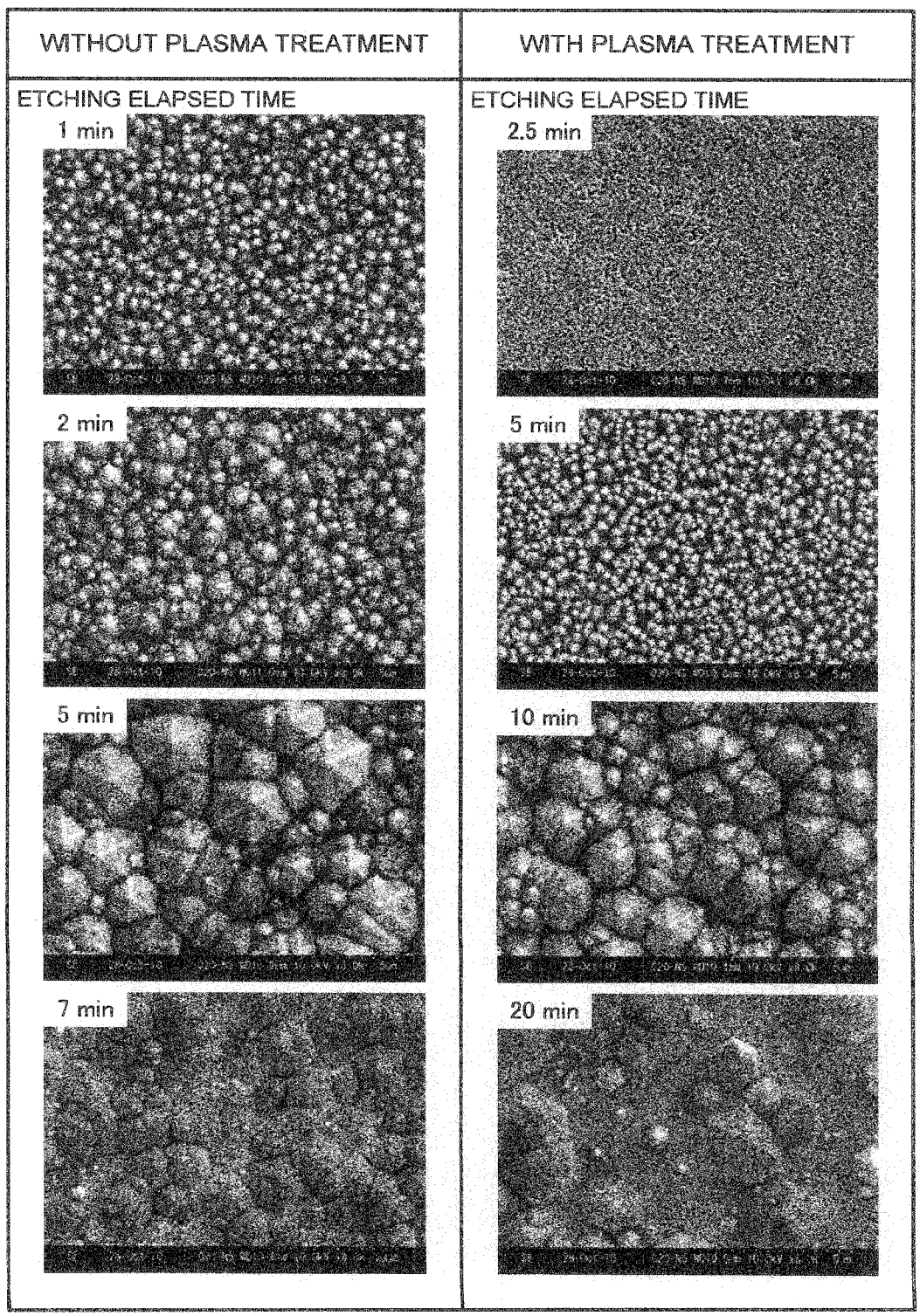
FIG. 1 is a view illustrating a principle of a method of producing a semiconductor light-emitting element of an embodiment.

The inventor of the present application has found that the etching rate of wet-etching with an alkaline solution is decreased by a plasma treatment of C⁻ plane of GaN with an inert gas. In order to demonstrate this finding, a surface of GaN after wet-etching without a plasma treatment and a surface of GaN after a plasma treatment followed by wet-etching are compared with each other over time. Electron microscope observation images (SEM (Scanning Electron Microscope) images) of results of experiments for comparison are shown in FIG. 1. In the experiments, plasma of Ar gas is used for a plasma treatment.

Four images on the left side of FIG. 1 show a surface of GaN after wet-etching without a plasma treatment. Four images on a right side of FIG. 1 show a surface of GaN after a plasma treatment followed by wet-etching. For comparison, the entire surface of GaN shown on the right side of FIG. 1 is subjected to a plasma treatment. In the drawings, images (at four stages) in which the sizes of micro-cones of both the surfaces are approximately the same are arranged side by side. Each time (1 min, 2.5 min, etc.) in the drawings shows an elapsed time (etching elapsed time) after immersion of GaN in a trimethyl ammonia solution (TMAH) kept at about 83° C. to 84° C.

When a plasma treatment was not performed as shown in FIG. 1, the formation of micro-cones started about one minute after initiation of wet-etching, and the micro-cones were formed on the entire surface in about five minutes. On the other hand, when a plasma treatment was performed, the formation of micro-cones started about five minutes after initiation of wet-etching, and the micro-cones were formed on the entire surface in about ten minutes. In a case of not performing a plasma treatment and in a case of performing a plasma treatment in lower portions of FIG. 1, a metal layer formed under a GaN layer partially appears after seven minutes and after 20 minutes, respectively. As can be seen from this comparison, wet-etching after a plasma treatment can delay the formation of micro-cones.

The reason why wet-etching is hard to proceed by irradiation with Ar plasma is considered that the arrangement of crystal in the surface of GaN is disturbed and a binding state in the surface changes to suppress the progress of oxidation action during the formation of micro-cones. In this experiment, plasma of Ar gas is used. However, even when plasma of another inert gas such as He, Ne, Kr, Xe, and Rn gases is used, it is supposed that the same effect would be obtained.

In the following embodiment, the above-described principle is applied to a method of producing a semiconductor light-emitting element.

First Embodiment

FIGS. 2A to 2D are cross-sectional views illustrating a method of producing a semiconductor light-emitting element according to a first embodiment of the present invention. For easy description and understanding, a portion of a semiconductor wafer in which two semiconductor light-emitting elements 10 are adjacent to each other will be described.

Figure 2A:
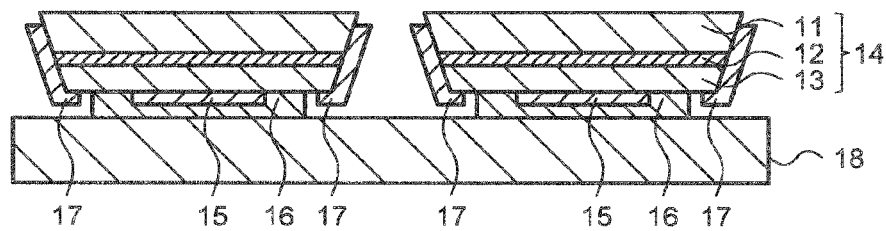
FIGS. 2A to 2D are cross-sectional views illustrating steps in the method of producing a semiconductor light-emitting element of the embodiment.

FIG. 2A is a cross-sectional view illustrating a step of manufacturing a semiconductor light-emitting element having a bonding structure. On a substrate for growth (not shown) used in crystal growth, an n-type semiconductor layer (first semiconductor layer) 11, an active layer 12, and a p-type semiconductor layer (second semiconductor layer) 13 that have a composition of $Al_xIn_yGa_zN$ ($0 \leq x \leq 1$, $0 \leq y \leq 1$, $0 \leq z \leq 1$, $x+y+z=1$) are sequentially grown. The n-type semiconductor layer 11, the active layer 12, and the p-type semiconductor layer 13 are collectively referred to as a semiconductor structure layer 14. For growth of the semiconductor structure layer 14, a metal organic chemical vapor deposition (MOCVD) method was used.

In this embodiment, a buffer layer (not shown), an n-GaN layer 11, an active layer 12 of an InGaN layer/a GaN layer, a p-AlGaN clad layer (not shown), and a p-GaN layer 13 were sequentially grown on a sapphire substrate in which a crystal growth plane was a C plane.

Next, a p-electrode 15 is formed on the p-type semiconductor layer 13. For the formation of the p-electrode 15, for example, a sputtering method and an electron beam evaporation method can be used. In this embodiment, a patterned mask (not shown) was formed on the p-type semiconductor layer 13, a Ni layer, an Ag layer, and a Ni layer were sequentially formed by an electron beam evaporation method, and the mask was removed through a lift-off method, to form the p-electrode 15.

Subsequently, a metal layer 16 is formed so as to cover the entire p-electrode 15. The metal layer 16 includes a cap layer (not shown) of preventing migration of a material for the p-electrode 15 and a joint layer (not shown) used to be bonded to a supporting substrate described below. As a material for the metal layer 16, a metal material such as Ti, TiW, Pt, Ni, Au, AuSn, and Cu can be used. For the formation of the metal layer 16, for example, a sputtering method and an electron beam evaporation method can be used. In this embodiment, a Ti layer, a Pt layer, and an AuSn layer were formed so as to cover the entire p-electrode 15.

Next, the semiconductor structure layer 14 is separated for each element, and a protective film 17 is formed on a side portion of the semiconductor structure layer 14. For the formation of the protective film 17, a sputtering method was used. As a material for the protective film 17, an insulation material such as $SiO_2$ and SiN can be used. In this embodiment, a $SiO_2$ film was formed on the side portion of the semiconductor structure layer 14.

Subsequently, a supporting substrate 18 is prepared separately, and bonded to the semiconductor structure layer 14 through the metal layer 15. As a material for the supporting substrate 18, for example, a Si substrate having a metal layer of AuSn or Au (not shown) formed on a surface or a known material such as a plated Cu alloy can be used. For bonding between the semiconductor structure layer 14 and the supporting substrate 18, thermocompression bonding was used. In this embodiment, a Si substrate 18 having an AuSn layer formed and the metal layer 15 formed on a side of the semiconductor structure layer 14 were joined by heating and compression bonding.

Subsequently, the substrate for growth used for the growth of the semiconductor structure layer 14 is removed from the semiconductor structure layer 14. For the removal of the substrate for growth, laser lift-off was used. In this embodiment, the sapphire substrate was irradiated using a KrF excimer laser, to separate the sapphire substrate from the n-GaN layer 11. Thus, the sapphire substrate is removed to expose the C⁻ plane of the n-GaN layer 11, that is, the N polarity plane of GaN.

Figure 2B:
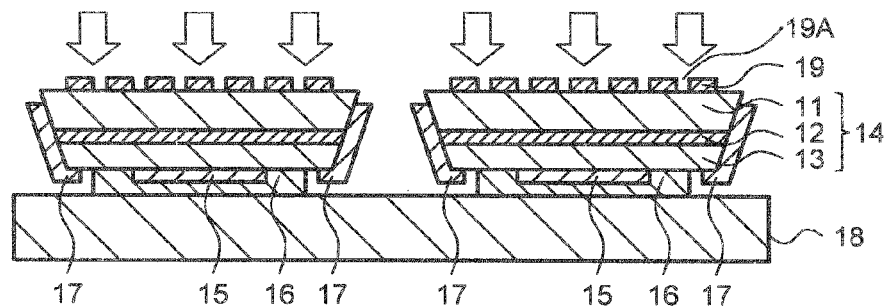

Next, as shown in FIG. 2B, a mask layer 19 having a pattern including a plurality of openings 19A that are arranged at equal intervals along a crystal axis of the semiconductor material is then formed on the n-type semiconductor layer 11. As a material for the mask layer 19, for example, a photoresist can be used. In this embodiment, a mask layer 19 having a pattern in which circle openings 19A with a diameter of 300 nm were arranged at a pitch of 1.5 μm in a triangular grid shape was formed on the surface of the n-GaN layer 11. Specifically, a resist layer was applied to the entire surface of the n-GaN layer 11, and pre-baked on a hot plate. Next, the photoresist was exposed to UV light through the pattern. A wafer was then immersed in a developer to perform development of the pattern.

Subsequently, the surface of the n-type semiconductor layer 11 exposed from the openings 19A in the mask layer 19 was subjected to a plasma treatment by an inert gas. As a material for the inert gas, for example, Ar can be used. For the plasma treatment, for example, a sputtering equipment, a dry etching equipment, and the like, can be used. In this embodiment, an exposed portion of the n-GaN layer 11 was irradiated with plasma of Ar for about 5 minutes using a reverse sputtering function of a sputtering equipment.

Figure 2C:
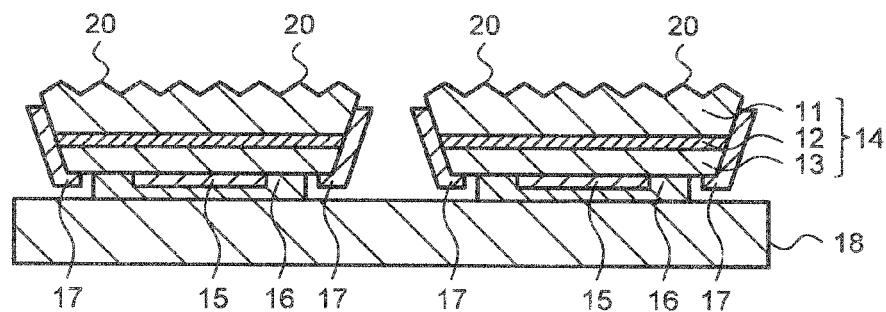

As shown in FIG. 2C, the mask layer 19 was removed using an organic solvent, and the surface of the n-type semiconductor layer 11 was wet etched with an alkaline solution. Specifically, the semiconductor wafer was immersed in an alkaline solution such as a tetramethyl ammonia solution (TMAH) and a potassium hydroxide solution (KOH). In this embodiment, the wafer was immersed in TMAH of about 70° C. At that time, a plurality of hexagonal pyramid protrusions that were arranged according to the arrangement form of the openings 19A in the mask layer 19 and derived from a crystal structure, that is, micro-cones 20 were formed on the surface of the n-type semiconductor layer 11.

Figure 2D:
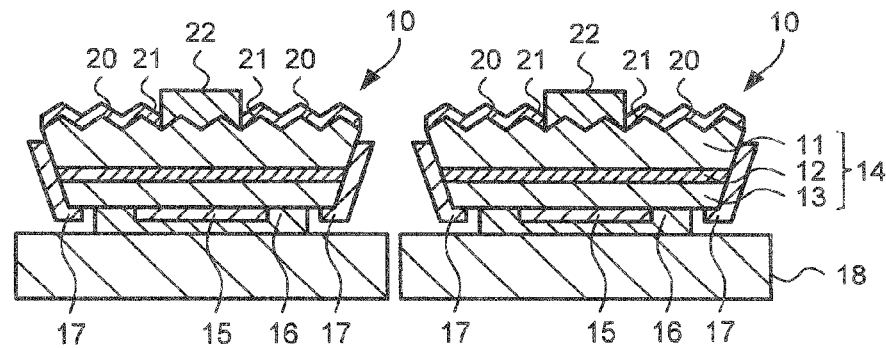

As shown in FIG. 2D, a protective layer 21 was then formed on the surface of the n-type semiconductor layer 11. As a material for the protective layer 21, an insulation material such as $SiO_2$ and SiN can be used. For the formation of the protective layer 21, a sputtering method was used. It is not necessary that the protective layer 21 be formed in a portion where to form an n-electrode 22 described below.

Next, the n-electrode 22 is formed on the surface of the n-type semiconductor layer 11. For the formation of the n-electrode 22, for example, a sputtering method and an electron beam evaporation method can be used. In this embodiment, a portion where the protective layer 21 was not formed was formed on the surface of the n-type semiconductor layer 11, a patterned mask (not shown) was formed on the n-type semiconductor layer 11, a Ti layer, an Al layer, a Ti layer, a Pt layer, and an Au layer were sequentially formed through an electron beam evaporation method, and the mask was removed through a lift-off method, to form the n-electrode 22. After that, the supporting substrate 18 was divided for each element, to obtain the semiconductor light-emitting elements 10.

Figure 3A:
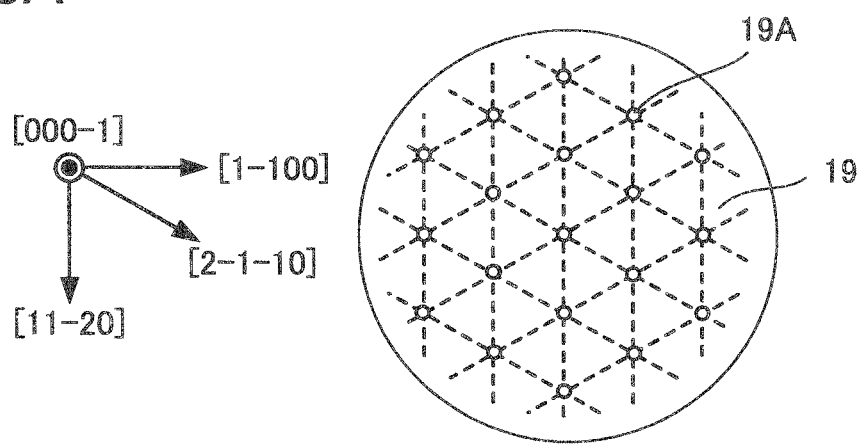
FIGS. 3A and 3B are views illustrating the arrangement of openings of a mask layer.
Figure 3B:
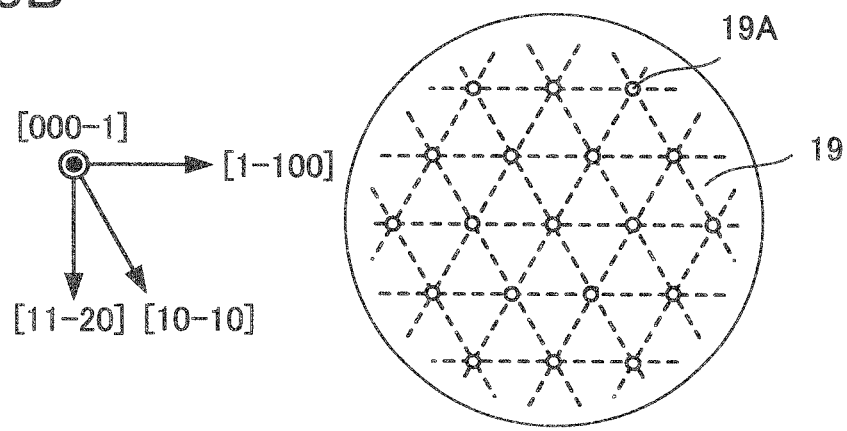

The arrangement form of the openings 19A in the mask layer 19 will be described with reference to FIGS. 3A and 3B. FIGS. 3A and 3B schematically show the surface of the mask layer 19, and in the drawings, dashed lines show crystal axes of the semiconductor structure layer 14.

In this embodiment, the openings 19A in the mask layer 19 were formed in the arrangement form shown in FIG. 3A. Specifically, the openings 19A are arranged at equal intervals so that the openings 19A adjacent to any one of the opening 19A are each disposed at vertexes of a regular hexagon and two opposing sides of the regular hexagon are parallel to a [11-20] direction of the crystal axis of the semiconductor structure layer 14. In other words, the plurality of openings 19A are arranged at equal intervals in the [11-20] direction of the crystal axis of the semiconductor structure layer 14 and at equal intervals in a [2-1-10] direction. The direction of the crystal axis of the semiconductor structure layer 14 can be known, for example, on the basis of a cutting portion called an orientation flat (OF) that is usually formed in the substrate for growth and shows the crystal orientation.

The openings 19A in the mask layer 19 may be formed in the arrangement form shown in FIG. 3B, Specifically, the openings 19A are arranged at equal intervals so that the openings 19A adjacent to any one of the opening 19A are each disposed at vertexes of a regular hexagon and two opposing sides of the regular hexagon are parallel to a [1-100] direction of the crystal axis of a semiconductor film 20. In other words, the openings 19A are arranged at equal intervals in a [1-100] direction of the crystal axis of the semiconductor film 20 and at equal intervals in a [10-10] direction. This arrangement form corresponds to one obtained by rotating the arrangement of the openings 19A of FIG. 3A by 90°.

Figure 6:
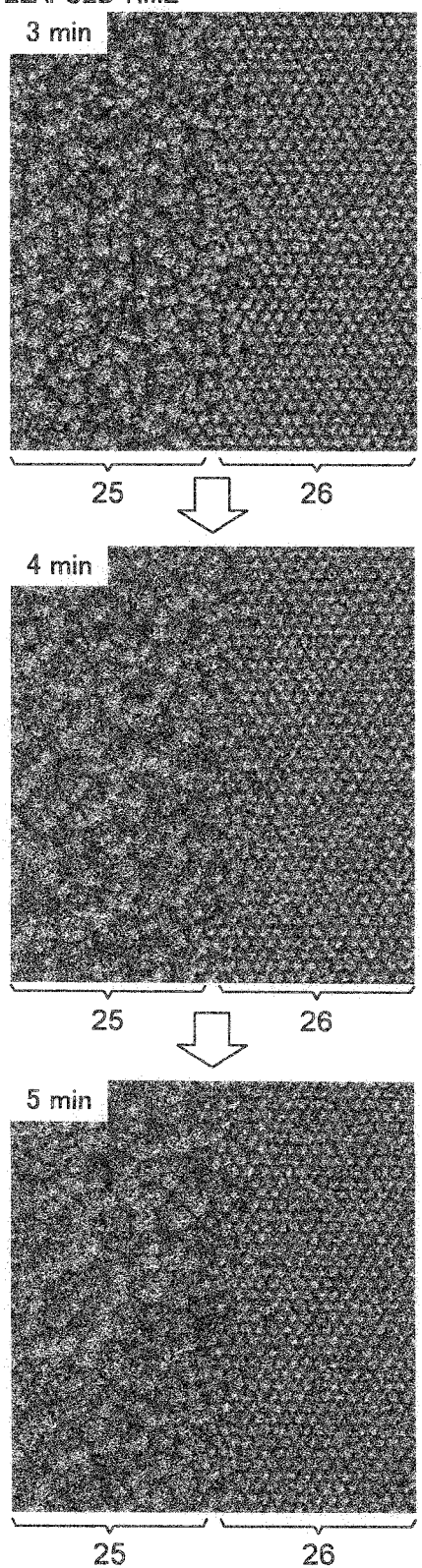
FIG. 6 is a view showing a surface of an n-type semiconductor layer in a wet-etching step for a comparative example.

The progress of the formation of micro-cones in the arrangement form shown in FIG. 3A and the arrangement form shown in FIG. 3B is as described in Patent Document 1 (FIGS. 6 and 4, respectively, in Patent Document 1). There are differences during the formation of micro-cones in both the arrangement forms in terms of a portion and a timing in which the formation of the micro-cones is completed.

In the arrangement form shown in FIG. 3A (this embodiment), when sides of the regular hexagon at a bottom of adjacent micro-cones come into contact with each other, the formation of the micro-cones is completed. Therefore, the deepest portions of the micro-cones in this case are sides of plane of the regular hexagon at the bottom of the micro-cones. In contrast, in the arrangement form shown in FIG. 3B, when vertexes of the regular hexagon at the bottom of the adjacent micro-cones come into contact with each other, the formation of the micro-cones is completed. Therefore, the deepest portions of the micro-cones in this case are vertex portions of plane of the regular hexagon at the bottom of the micro-cones.

Accordingly, a time required until the formation of the micro-cones in the arrangement form shown in FIG. 3A is completed is shorter, and the bottom of the micro-cones is easily controlled. This arrangement form is preferred in terms of improvement of light extraction efficiency and reliability. In contrast, in the arrangement form shown in FIG. 3B, it is difficult to control the bottom of the micro-cones. Therefore, a time required until the formation of each micro-cone is completed may be dispersed. For example, a portion where etching does not proceed or a portion where etching excessively proceeds may be formed at the vertex portions of the regular hexagon at the bottom. The portion where etching does not proceed exists as a flat portion, and the flat portion does not contribute to the improvement of light extraction efficiency. When etching excessively proceeds, exposure of the electrode material and the like may occur to decrease reliability.

Figure 4A:
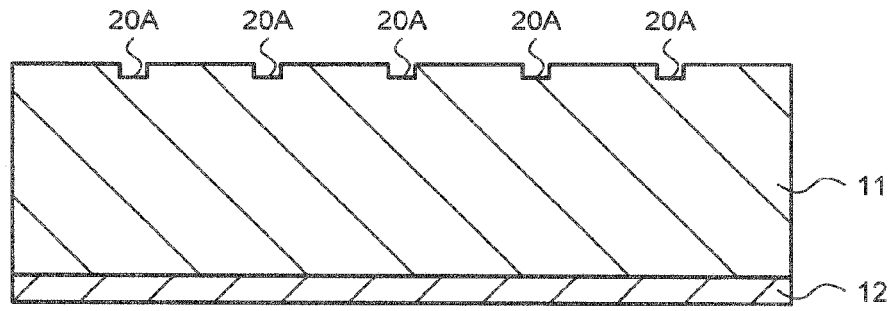
FIGS. 4A to 4D are cross-sectional views illustrating a wet-etching step of the embodiment.

With reference to FIGS. 4A to 4D, progress of the formation of the protrusions 20 at the wet-etching step of FIG. 2C will be specifically described. FIG. 4A is an enlarged view showing the cross section of surface of the n-type semiconductor layer 11 in which the mask 19 is removed after the plasma treatment step. Portions (i.e., plasma irradiation portions) 20A which are irradiated with plasma are recessed compared to other surface portions after the plasma treatment. These recessed portions have a substantially columnar shape. Specifically, a bottom of the recessed portions is a flat plane parallel to the other surface portion that is the C⁻ plane. This recessed portion is very shallow, and for example, has a depth of less than 50 nm, and preferably 30 to 40 nm. FIG. 5A shows a SEM image of the surface of the n-type semiconductor layer 11 in this state which is viewed from the top surface of the element, that is, a plane perpendicular to the n-type semiconductor layer 11.

Figure 4B:
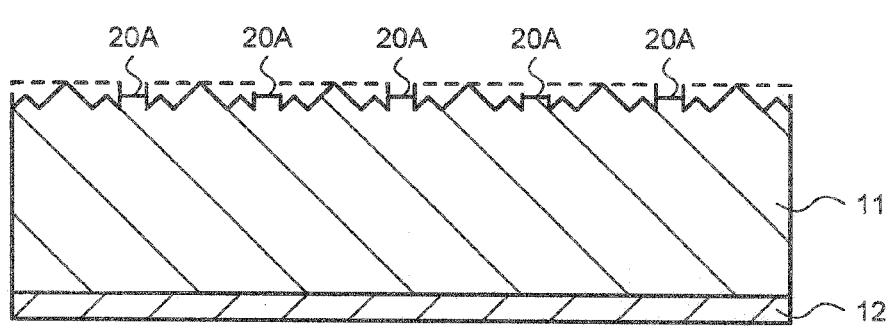
Figure 5A:
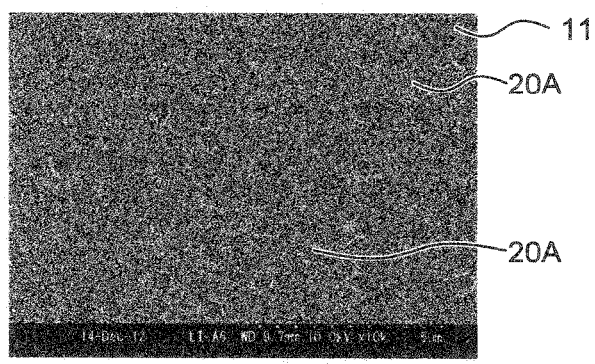
FIGS. 5A to 5D are views showing a surface of an n-type semiconductor layer in the wet-etching step of the embodiment.
Figure 5B:
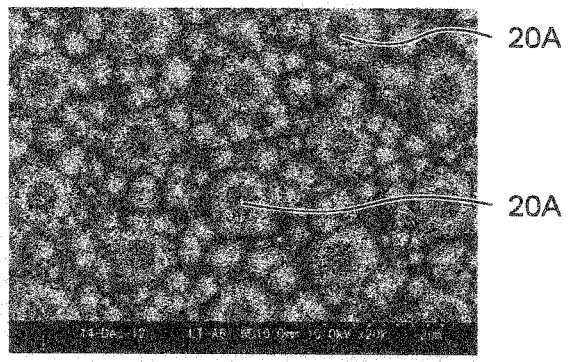

When wet-etching is initiated, small micro-cones are formed on a surface except for the plasma irradiation portions 20A, as shown in FIG. 4B. At this time, etching of the plasma irradiation portions 20A does not proceed. FIG. 5B shows a SEM image of the surface of the n-type semiconductor layer 11 in this state which is viewed from the top surface of the element.

Figure 4C:
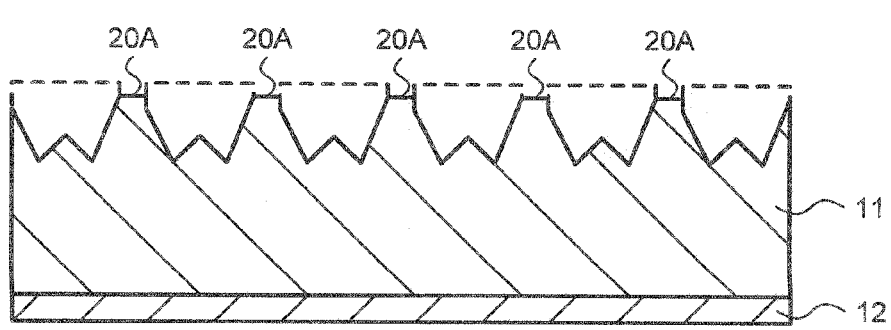
Figure 5C:
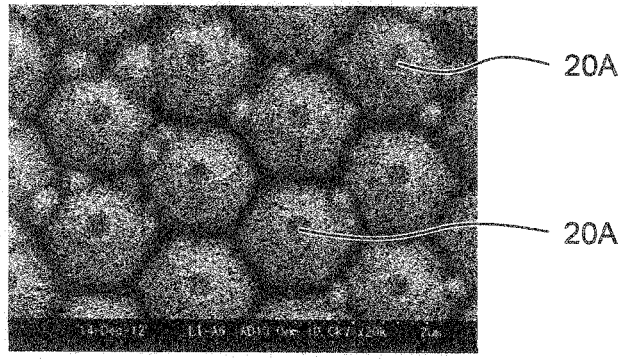

When etching further proceeds, the plasma irradiation portions 20A function as cores, and the sizes of the micro-cones become uniform, as shown in FIG. 4C. At this time, etching of the plasma irradiation portions 20A does not almost proceed. However, as etching proceeds, etching of portions under the plasma irradiation portions 20A from lower side portions of the plasma irradiation portions 20A (referred to as side etching or undercut) proceeds. FIG. 5C shows a SEM image of the surface of the n-type semiconductor layer 11 in this state which is viewed from the top surface of the element.

Figure 4D:
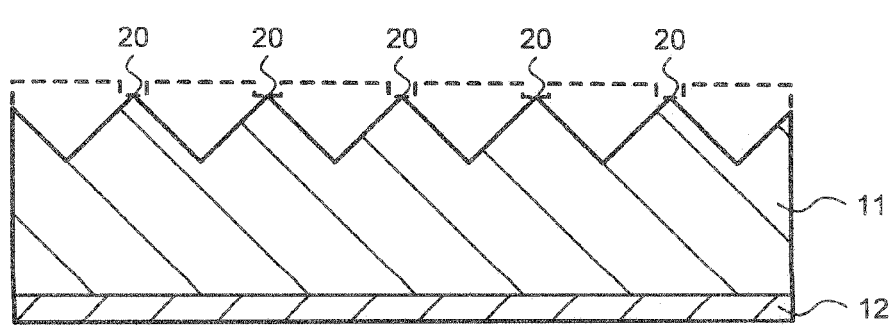
Figure 5D:
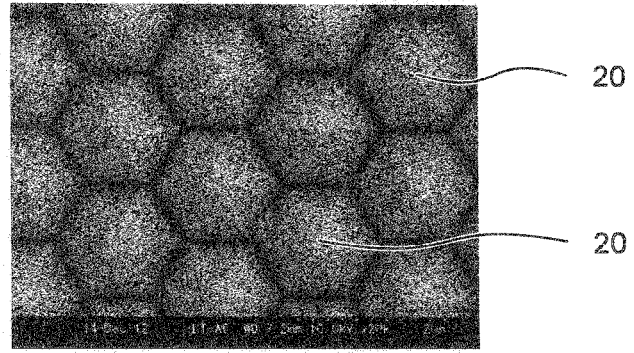

When etching is further promoted, etching further proceeds from the top surface of the plasma irradiation parts 20A, as shown in FIG. 4D. In addition, side etching proceeds. The plasma irradiation portions 20A are finally removed completely. Thus, the plasma irradiation portions 20A, that is, hexagonal pyramid protrusions 20 in which the openings 19A in the mask layer 19 are crests are formed. The protrusions 20 are formed so as to have a uniform shape in a closest packed arrangement on the surface of the n-type semiconductor layer 11. FIG. 5D shows a SEM image of the surface of the n-type semiconductor layer 11 in this state which is viewed from the top surface of the element. The closest packed arrangement refers to an arrangement in which a plurality of micro-cones having a regular hexagon-shaped bottom are arranged without a gap on a plane, as shown in FIG. 5D, or a so-called honeycomb-shaped arrangement.

FIG. 6 shows SEM images showing a change with time during wet-etching of a surface of an n-GaN layer formed by a method of producing a semiconductor light-emitting element in a comparative example for the embodiment. A semiconductor light-emitting element produced in accordance with the method of the comparative example has a portion (comparison portion) 25 where a half of the surface of the n-GaN layer was not subjected to a plasma treatment and a portion (plasma treatment portion) 26 where the rest of the surface of the n-GaN layer was subjected to a plasma treatment in the same manner as in the present embodiment. In the comparative example, the semiconductor light-emitting element was produced through the same steps as in the embodiment except that a mask layer having a portion having no opening (corresponding to the comparison portion 25) and a part having an opening (corresponding to the plasma treatment portion 26) was used.

A left side of each image of FIG. 6 is the comparison portion 25 which was not subjected to a plasma treatment. In contrast, a right side of each image of FIG. 6 is the plasma treatment portion 26 which was subjected to a plasma treatment. Each image of FIG. 6 is a SEM image of the surface of the n-GaN layer. Each time (3 min, 4 min, etc.) in each image shows an elapsed time (etching elapsed time) after immersion of a wafer in TMAH at the step of performing wet-etching.

As shown in FIG. 6, in the comparison portion 25 (left side), etching continuously proceeds, and the micro-cones continuously increase in size. In contrast, in the plasma treatment portion 26 (right side), once the formation of the micro-cones is completed (in about three minutes elapse after etching), etching does not continue. This is because the formation of substantially all of protrusions is completed substantially simultaneously and a crystal plane which is susceptible to etching, that is, the C$^-$ plane of n-GaN vanishes substantially simultaneously. Therefore, etching does not excessively proceed, and protrusions that do not contribute to improvement of light extraction efficiency are not formed.

In this embodiment, a case where a resist is used for the material of the mask layer is described. However, the material of the mask layer is not restricted to a resist. For example, the mask layer may be formed from an insulation material such as $SiO_2$ and SiN or a metal material such as Ag and Pt.

Further, a case where the mask layer having a pattern of circular openings is formed is described. However, the shape of openings may not be circular. For example, the openings may have a polygonal shape or an oval shape.

A case where the diameter of the openings is 300 nm is described. However, the diameter of the openings is not restricted to 300 nm. In consideration of control properties of shape and size of micro-cones, it is preferable that the openings have a diameter of 50 to 1,000 nm. In a case where the diameter of the openings is less than 50 nm, the plasma irradiation portions, that is, portions where the openings are irradiated with plasma are removed at an earlier stage after initiation of wet-etching, and the shape and size of the micro-cones cannot be controlled.

A case where the pitch between the openings is 1.5 μm is described. However, the pitch between the openings is not restricted to 1.5 μm. In consideration of formation of micro-cones of improving the light extraction efficiency, it is preferable that the pitch between the openings be 1 to 5.5 μm. For example, a pitch most suitable for improvement of light extraction efficiency can be determined according to the wavelength of light emitted from the active layer.

Each condition in a plasma treatment (plasma gas, treatment time, etc.) can be appropriately controlled according to a device used in the plasma treatment, a composition and state of a surface to be treated, the size of protrusions to be formed, or the like.

As described above, the method of producing a semiconductor light-emitting element according to the present invention includes: forming a mask layer having a plurality of openings that are arranged at equal intervals along a crystal axis of a semiconductor structure layer on a surface of a hexagonal crystal semiconductor structure layer; performing a plasma treatment on the surface of the semiconductor structure layer exposed from the openings in the mask layer; and wet-etching the surface of the semiconductor structure layer to form a plurality of protrusions on the surface of the semiconductor structure layer.

Therefore, protrusions that are arranged regularly and have the same size can be uniformly formed. In addition, a decrease in reliability caused by excessive etching, generation of leakage current, and the like can be prevented. Accordingly, it is possible to provide a highly reliable semiconductor light-emitting element having high light-emitting efficiency.

REFERENCE NUMERALS LIST 10 semiconductor light-emitting element
14 semiconductor structure layer
19 mask layer
20 protrusion

The invention claimed is:
1. A method of producing a semiconductor light-emitting element including a semiconductor structure layer of a hexagonal crystal structure, the method comprising:

forming a mask layer having a plurality of openings that are arranged at equal intervals along a crystal axis of the semiconductor structure layer on a surface of the semiconductor structure layer;

performing a plasma treatment on the surface of the semiconductor structure layer exposed from the openings in the mask layer;

wherein a gas used in the plasma treatment is an inert gas;

removing the mask layer; and wet-etching the surface of the semiconductor structure layer to form a plurality of protrusions that are arranged according to the arrangement form of the plurality of openings and derived from the crystal structure of the semiconductor structure layer on the surface of the semiconductor structure layer.

2. The method according to claim 1, wherein:

the surface of the semiconductor structure layer is a $C^-$ plane; and the plurality of openings are each arranged so that the openings adjacent to any one of the openings are each disposed at each vertex of a regular hexagon, and two opposing sides of the regular hexagon are parallel to a [1-100] direction or a [11-20] direction of a crystal axis of the semiconductor structure layer.

3. The method according to claim 1, wherein the plurality of protrusions each have a hexagonal pyramid shape and are formed in a closest packed arrangement.

4. The method according to claim 1, wherein the wet-etching is a wet-etching with an alkaline solution.

* * * * *